United States Patent [19]
Cambou

[11] Patent Number: 5,283,454
[45] Date of Patent: Feb. 1, 1994

[54] SEMICONDUCTOR DEVICE INCLUDING VERY LOW SHEET RESISTIVITY BURIED LAYER

[75] Inventor: Bertrand Cambou, Mesa, Ariz.

[73] Assignee: Motorola, Inc., Schaumburg, Ill.

[21] Appl. No.: 943,642

[22] Filed: Sep. 11, 1992

[51] Int. Cl.$^5$ .............................................. H01L 29/10
[52] U.S. Cl. .................................... 257/328; 257/341; 257/343; 257/382; 257/401; 257/587; 257/596; 257/611
[58] Field of Search ............... 257/328, 341, 343, 382, 257/401, 587, 596, 611

[56] References Cited

U.S. PATENT DOCUMENTS 4,890,142 12/1989 Tonnel et al. ...................... 257/401
4,972,239 11/1990 Mihara .............................. 257/341

FOREIGN PATENT DOCUMENTS 63-17555 1/1988 Japan .

Primary Examiner—William Mintel
Assistant Examiner—Roy Potter
Attorney, Agent, or Firm—Eugene A. Parsons

[57] ABSTRACT

A metal or silicide buried layer in MOS semiconductor devices provides a drain contact on the upper surface of the device with a greatly reduced resistance. The methods of manufacture include depositing the buried layer, rather than diffusing, so that interference with other components is greatly reduced and spacing between components is reduced to reduce the over-all size of the device.

2 Claims, 3 Drawing Sheets

SEMICONDUCTOR DEVICE INCLUDING VERY LOW SHEET RESISTIVITY BURIED LAYER

FIELD OF THE INVENTION

The present invention pertains to semiconductor devices and the manufacture thereof and more specifically to vertical MOS devices having all external contacts on a single surface of a semiconductor substrate.

BACKGROUND OF THE INVENTION

Generally, vertical MOS devices are constructed with gate and source external contacts on the front, or top, major surface of a semiconductor substrate and an external drain contact on the opposite (bottom or back) major surface. This structure is a natural result of the fact that the drain is formed first and can be contacted from the opposed major surface without additional manufacturing steps. However, having external contacts on both sides of the substrate severely limits the mounting and applications of the structure.

To overcome this problem, the prior art diffuses a heavily doped conductive buried layer in the substrate. An epitaxial layer is grown over the buried layer and a plurality of deep wells are diffused into the epitaxial layer so as to be in contact with the buried layer. Vertical MOS devices are then formed in the epitaxial layer so that the drains are in contact with the buried layer. External drain contacts are formed on the surface of the epitaxial layer in contact with the deep wells. Thus, all of the electrodes of the MOS devices are on the same side of the substrate and the mounting problems are eliminated.

One of the major problems that occurs in the prior art buried layer structure is that the buried layer, which is heavily doped to make it conductive, diffuses into the epitaxial layer during subsequent processing. To stop this diffusion from interfering with proper MOS device functions, the epitaxial layer must be formed thick enough so that the effects of up diffusion can be accounted for. This often requires an epitaxial layer thickness of more than 10 microns. Because of the thickness of the epitaxial layer, the diffused deep wells contacting the buried layer must be much deeper which, therefore, results in the width of the deep wells being very large. The width of the deep wells is larger than 30 microns which requires a substantial amount of substrate surface and greatly reduces the number of devices that can be formed in the substrate.

SUMMARY OF THE INVENTION

It is a purpose of the present invention to provide new and improved semiconductor devices including a very low resistivity buried layer and novel method of manufacture.

It is a further purpose of the present invention to provide new and improved semiconductor devices including a very low resistivity buried layer which substantially increases the number of devices formed on a substrate.

These and other purposes and advantages are realized in a semiconductor device with a very low sheet resistivity buried layer including a substrate, a semiconductor device formed in the substrate and having a plurality of electrodes, a very low sheet resistivity buried layer positioned in the substrate below the semiconductor device and in connection with one of the plurality of electrodes of the semiconductor device, and a conductive area formed in the substrate and connected to the buried layer so as to provide an external connection to the buried layer adjacent the surface of the substrate.

These and other purposes and advantages are further realized in a method of manufacturing a semiconductor device with a very low sheet resistivity buried layer including the steps of providing first and second semiconductor wafers each having first and second opposed major surfaces, diffusing a deep well into one of the wafers from the first major surface, forming a very low sheet resistivity layer on the one wafer adjacent and parallel to the first major surface of the one wafer and in contact with the deep well, growing a layer of insulating material on the first major surface of each of the wafers, positioning the wafers with the first major surfaces in parallel juxtaposition and the insulating layers in contact with the very low sheet resistivity layer positioned therebetween, growing insulating material between the layers of insulating material so that the grown layers of insulating material and grown insulating material are sandwiched between the first and second wafers and hold the first and second wafers in fixed relationship relative to each other, and forming a semiconductor device in the second major surface of the one wafer, the semiconductor device being formed with a plurality of electrodes and one of the electrodes being in contact with the very low sheet resistivity layer.

BRIEF DESCRIPTION OF THE DRAWINGS

Referring to the drawings.

DESCRIPTION OF THE PREFERRED EMBODIMENT

Figure 1:
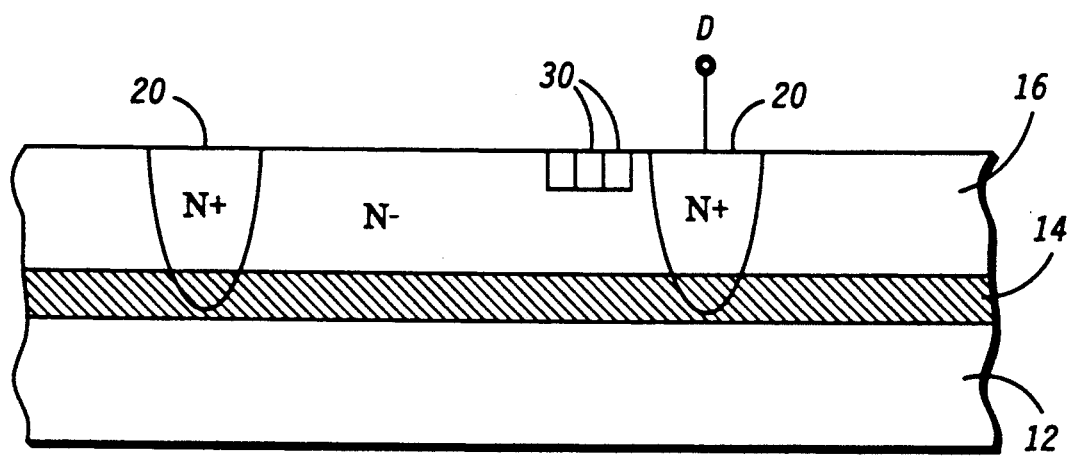
FIG. 1 is a sectional view of a semiconductor device formed in accordance with the present invention.
Figure 2:
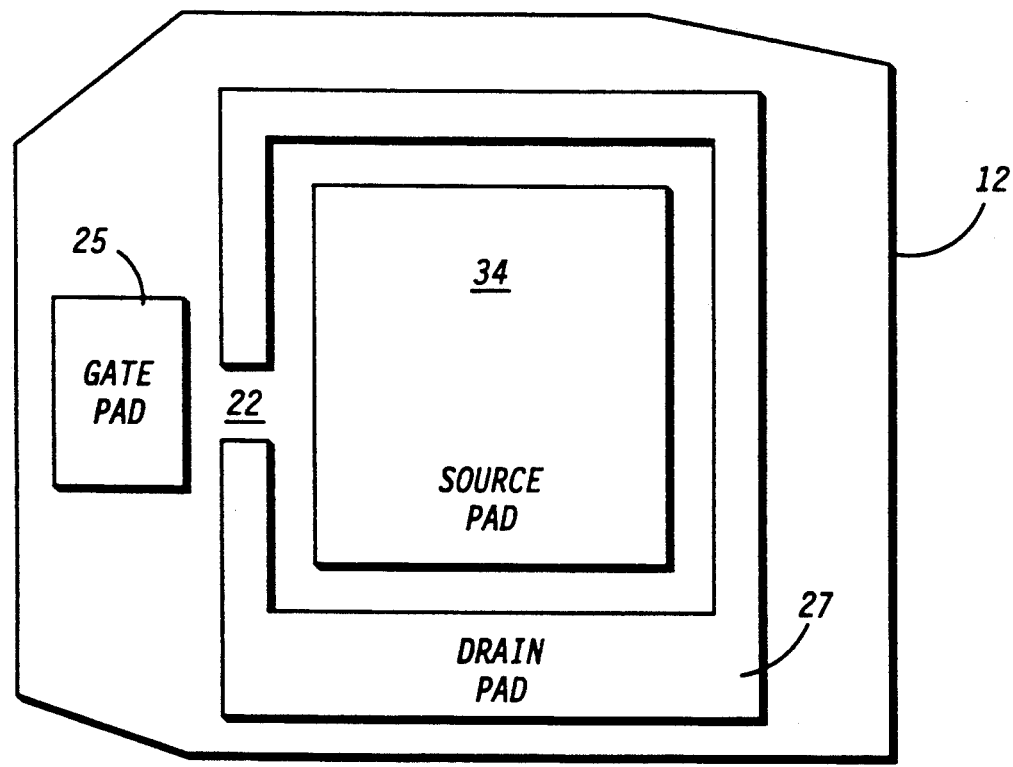
FIG. 2 is a view in top plan of the semiconductor device of FIG. 1.

FIG. 1 illustrates a semiconductor device 10 formed in accordance with the present invention. Semiconductor device 10 is formed on a substrate 12 which, in this specific embodiment, is a semiconductor wafer having a very low sheet resistivity buried layer 14 deposited thereon and a semiconductor layer 16, such as an epitaxial layer, deposited thereover. Layer 14 is a silicide or metal, such as the refractory metals commonly used in the semiconductor industry. A deep well 20 is diffused into layer 16 so as to be in contact with layer 14 and provide an external electrical contact thereto. Deep well 20, in this embodiment, is formed in the shape of a C (see FIG. 2) which substantially surrounds the device, except for an opening 22 in one side through which gate connections are extended to communicate with an external gate pad 25. A metallized area (see FIG. 2) is deposited on the surface of layer 16 to operate as an external drain pad 27 for semiconductor device 10.

A plurality of vertical MOS transistors 30 (cells) are formed within deep well 20, only three of which are illustrated in FIG. 1 for example. The plurality of transistors 30 within deep well 20 are all connected in parallel, as will be apparent presently, and form semiconductor device 10. The number of transistors 30 included in semiconductor device 10 is determined partly by predetermined parameters for semiconductor device 10 and partly by physical parameters of substrate 12 and the various manufacturing processes used, as will be explained more fully later.

Figure 3:
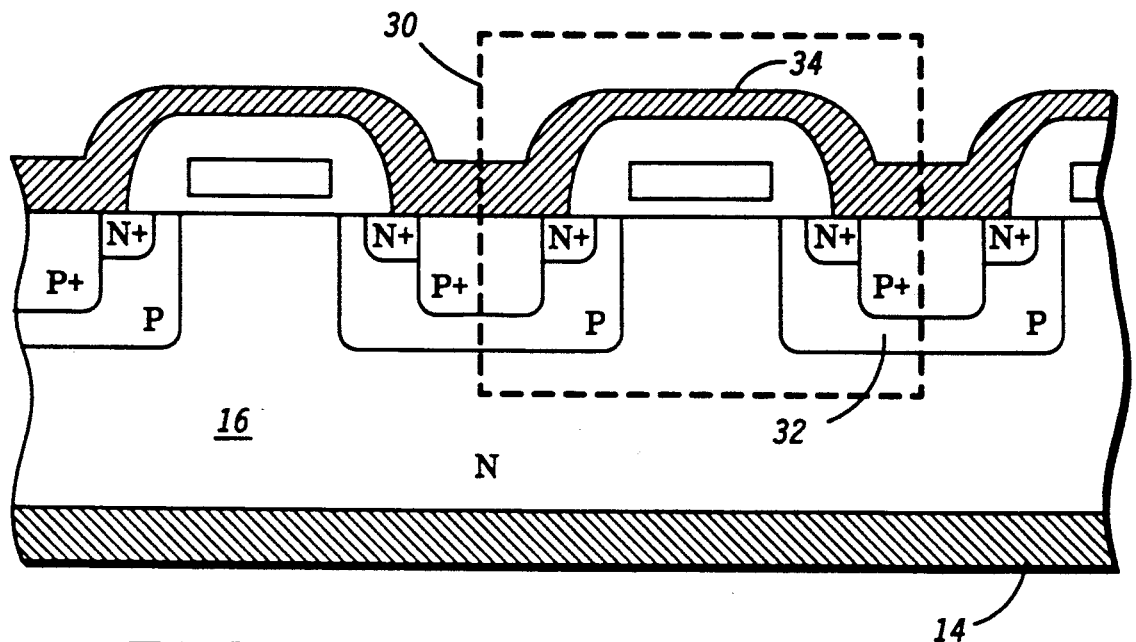
FIG. 3 is a greatly enlarged sectional view of a portion of FIG. 1.

Vertical MOS transistors 30 are illustrated in a greatly enlarged cross-section in FIG. 3. A single vertical MOS transistor 30 is included within an area defined by broken lines. Transistor 30 includes a source 32 diffused into layer 16 having an external metallized source pad 34 connected thereto (see FIG. 2). In this specific embodiment, all of the metallized source connections of all of the transistors 30 of semiconductor device 10 are connected together to form source pad 34. Layer 16 serves as the drain for each of transistors 30. Layer 16 is in contact with very low sheet resistivity buried layer 14 which is in turn in contact with drain pad 27 through deep well 20.

It should be noted that buried layers which are formed by deep diffusion, as in the prior art, have a sheet resistivity of approximately 10-20 ohms/square. Buried layers, such as very low sheet resistivity buried layer 14, have a sheet resistivity of approximately 1-2 ohms/square for a buried layer of silicide and 0.1-0.2 ohms per square for a buried layer of metal. Because the sheet resistivity of the buried layer is reduced by a factor of ten when using silicide and by another factor of ten when using metal, the spacing between deep wells, or the area within deep well 20 of FIGS. 1 and 2, can be substantially increased and the ON resistance of semiconductor device 10 is still lower than in prior art devices. This increase in space allows an increase in the number of transistors 30 included in each semiconductor device 10, which means that semiconductor devices capable of carrying higher currents can be constructed.

Figure 4:
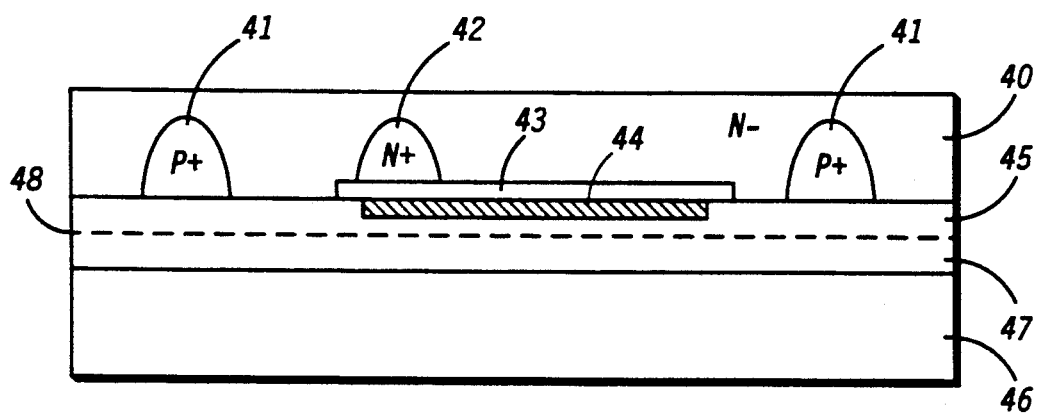
FIGS. 4-7 are a sectional views illustrating various methods of manufacturing semiconductor devices in accordance with the present invention.

FIGS. 4-7 illustrate several methods of manufacturing very low sheet resistivity buried layers. Referring specifically to FIG. 4, a first silicon wafer 40 is provided. Deep wells 41 and 42 are diffused into wafer 40 for isolation and drain contacts, respectively, or for any other of a variety of purposes. An area 43 is diffused to form a highly conductive N+ region and a metal layer 44 is deposited thereon to form a very low sheet resistivity buried layer. A layer 45 of silicon dioxide, or any other convenient dielectric, is grown over the entire surface of wafer 40 and planarized by any convenient method. A second silicon wafer 46 is provided and a silicon dioxide layer 47, or any other convenient dielectric, is grown on one surface thereof. Layer 47 is also planarized so that the surfaces of layer 45 and 47 are placed together in a continuous smooth junction, denoted by broken line 48. The structure is heated and/or pressurized slightly so that the silicon dioxide layers 45 and 47 grow together to firmly bond wafers 40 and 46 into a single structure. The external surface of wafer 40 is then polished to reduce the thickness to a predetermined amount and to expose deep wells 41 and 42.

Here it should be noted that most of the manufacturing procedures which require high and/or long applications of heat are performed prior to the deposition of metal layer 44. Thus, there is little or no diffusion of metal layer 44 into wafer 40 and the thickness of wafer 40 can be substantially reduced. As an example, wafer 40 is polished to reduce the thickness to approximately 7 microns from the junction represented by broken line 48 to the external surface. Since the thickness of the epitaxial layer which covers the buried layer in prior art wafers is on the order of 15 microns, this procedure provides a reduction in thickness of greater than one half. Because of the reduction in thickness of wafer 40, deep wells 41 and 42 are made much shallower and, as a result, have a much smaller width, generally at least a factor of two smaller than deep wells in prior art devices. This reduction in size of deep wells 41 and 42 increases the area available for semiconductor devices. As an example, taking into account the reduction in deep well width and the increased size allowable because of the reduced resistance of the buried layer, the number of transistors which can be placed in a side-by-side relationship between deep well 20 in FIG. 1 is increased from seven in comparable prior art devices to at least twenty in the present structure.

Figure 5:
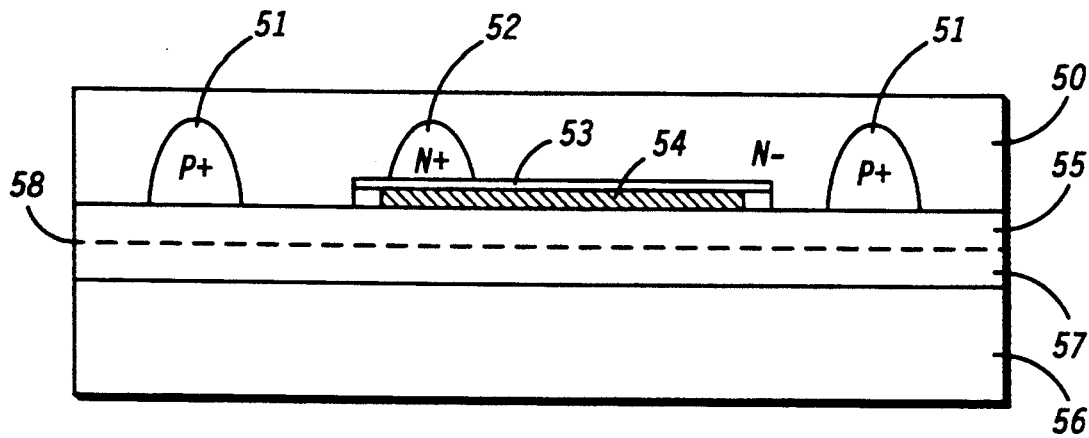

Referring specifically to FIG. 5, a first silicon wafer 50 is provided. Deep wells 51 and 52 are diffused into wafer 50 for isolation and drain contacts, respectively, or for any other of a variety of purposes. An opening is etched in the surface of wafer 50 and an area 53 is diffused into the bottom surface of the opening to form a highly conductive N+ region. A metal layer 54 is deposited on area 53 to form a very low sheet resistivity buried layer. A layer 55 of silicon dioxide, or any other convenient dielectric, is grown over the entire surface of wafer 50 and planarized by any convenient method. A second silicon wafer 56 is provided and a silicon dioxide layer 57, or any other convenient dielectric, is grown on one surface thereof. Layer 57 is also planarized so that the surfaces of layer 55 and 57 are placed together in a continuous smooth junction, denoted by broken line 58. The structure is heated and/or pressurized slightly so that the silicon dioxide layers 55 and 57 grow together to firmly bond wafers 50 and 56 into a single structure. The external surface of wafer 50 is then polished to reduce the thickness to a predetermined amount and to expose deep wells 51 and 52.

Figure 6:
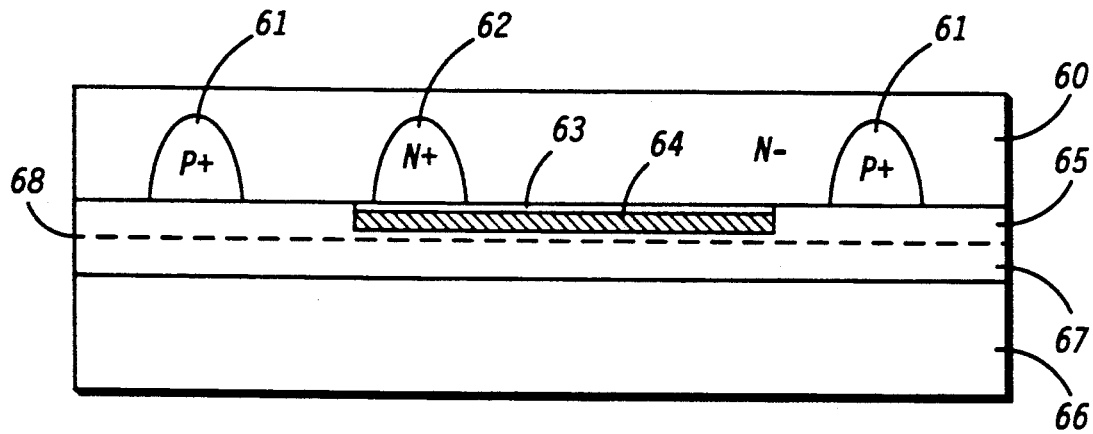

Referring specifically to FIG. 6, a first silicon wafer 60 is provided. Deep wells 61 and 62 are diffused into wafer 60 for isolation and drain contacts, respectively, or for any other of a variety of purposes. A silicon layer 63 is deposited on the surface of wafer 60 and doped to form a highly conductive N+ region and a metal layer 64 is deposited thereon to form a very low sheet resistivity buried layer. A layer 65 of silicon dioxide, or any other convenient dielectric, is grown over the entire surface of wafer 60 and planarized by any convenient method. A second silicon wafer 66 is provided and a silicon dioxide layer 67, or any other convenient dielectric, is grown on one surface thereof. Layer 67 is also planarized so that the surfaces of layer 65 and 67 are placed together in a continuous smooth junction, denoted by broken line 68. The structure is heated and/or pressurized slightly so that the silicon dioxide layers 65 and 67 grow together to firmly bond wafers 60 and 66 into a single structure. The external surface of wafer 60 is then polished to reduce the thickness to a predetermined amount and to expose deep wells 61 and 62.

Figure 7:
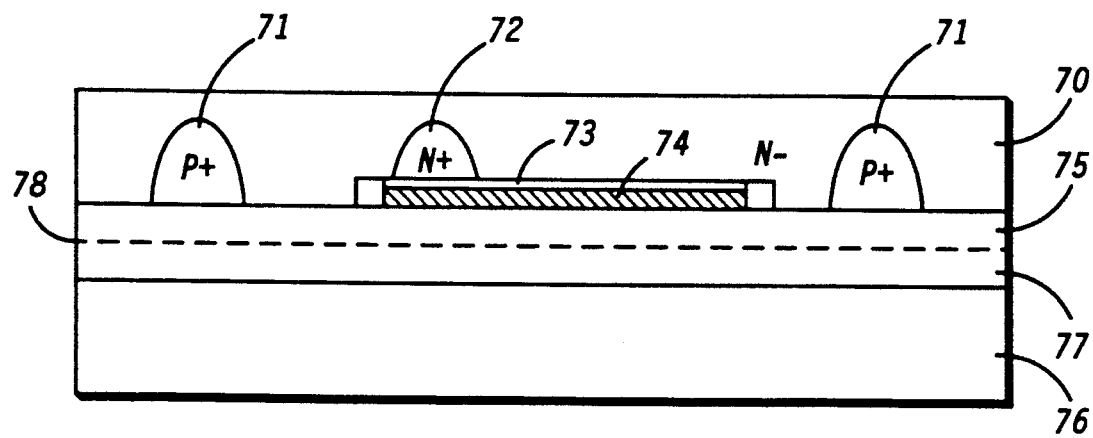

Referring specifically to FIG. 7, a first silicon wafer 70 is provided. Deep wells 71 and 72 are diffused into wafer 70 for isolation and drain contacts, respectively, or for any other of a variety of purposes. An opening is formed, by etching or the like, in the surface of wafer 70 and a silicon layer 73 is deposited on the bottom surface of the opening and doped to form a highly conductive N+ region. A metal layer 74 is deposited on the surface of layer 73 to form a very low sheet resistivity buried layer. A layer 75 of silicon dioxide, or other convenient dielectric, is grown over the entire surface of wafer 70 and planarized by any convenient method. A second silicon wafer 76 is provided and a silicon dioxide layer 77, or any other convenient dielectric, is grown on one surface thereof. Layer 77 is also planarized so that the surfaces of layer 75 and 77 are placed together in a continuous smooth junction, denoted by broken line 78. The structure is heated and/or pressurized slightly so that the silicon dioxide layers 75 and 77 grow together to firmly bond wafers 70 and 76 into a single structure. The external surface of wafer 70 is then polished to reduce the thickness to a predetermined amount and to expose deep wells 71 and 72.

It will of course be understood by those skilled in the art that many other variations of the above methods may be devised. Each of these methods has some advantages and disadvantages over other of the methods, including more or less processing steps, more or less masks utilized during the processing, etc. In each of the disclosed methods the buried layer is deposited on the surface of the wafer, rather than being diffused into the wafer which confines the buried layer to a smaller volume. It should be understood, however, that in some embodiments a shallow diffusion from the surface of the wafer (40, 50, 60 or 70) would provide some advantages, since the major steps including high/long temperatures have already been performed and additional diffusion during subsequent steps is held to a minimum.

Thus, improved semiconductor devices with a very low sheet resistivity buried layer are disclosed and improved methods of manufacturing the devices. Because of the very low sheet resistivity buried layer many more semiconductor cells (transistors, etc.) can be formed in a given area that allows a semiconductor device to be manufactured which can carry more current and/or requires less space. Further, because the buried layer does not diffuse into other areas, in some instances the characteristics (e.g. breakdown voltages, leakage, etc.) of the cells and ultimate device are improved.

While I have shown and described specific embodiments of the present invention, further modifications and improvements will occur to those skilled in the art. I desire it to be understood, therefore, that this invention is not limited to the particular forms shown and I intend in the append claims to cover all modifications that do not depart from the spirit and scope of this invention.

What is claimed is:

1. A semiconductor device with a very low sheet resistivity buried layer comprising:
    a substrate;
    a semiconductor device formed in the substrate and having a plurality of electrodes;
    a very low sheet resistivity buried layer positioned in the substrate below the semiconductor device and in connection with one of the plurality of electrodes of the semiconductor device, the buried layer including a refractory metal; and
    a conductive area formed in the substrate and connected to the buried layer so as to provide an external connection to the buried layer adjacent the surface of the substrate.

2. A semiconductor device with a very low sheet resistivity buried layer comprising:
    a substrate;
    a semiconductor device formed in the substrate and having a plurality of electrodes;
    a very low sheet resistivity buried layer positioned in the substrate below the semiconductor device and in connection with one of the plurality of electrodes of the semiconductor device, the buried layer including silicide; and
    a conductive area formed in the substrate and connected to the buried layer so as to provide an external connection to the buried layer adjacent the surface of the substrate.

* * * * *